(12) United States Patent
Fukuda

(10) Patent No.: US 8,304,788 B2
(45) Date of Patent: Nov. 6, 2012

(54) DISPLAY APPARATUS AND METHOD OF PRODUCING SAME

(75) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 336 days.

(21) Appl. No.: 12/674,013

(22) PCT Filed: Nov. 13, 2008

(86) PCT No.: PCT/JP2008/071061
§ 371 (c)(1),
(2), (4) Date: Feb. 18, 2010

(87) PCT Pub. No.: WO2009/064021
PCT Pub. Date: May 22, 2009

(65) Prior Publication Data
US 2011/0101386 A1 May 5, 2011

(30) Foreign Application Priority Data

Nov. 14, 2007 (JP) ................................. 2007-295591
Nov. 5, 2008 (JP) ................................. 2008-284513

(51) Int. Cl.
*H01L 33/00* (2010.01)

(52) U.S. Cl. ....... 257/89; 257/40; 257/98; 257/E33.072; 257/E51.022; 313/506; 313/507; 313/508; 313/509

(58) Field of Classification Search .................. 257/89, 257/40, 98, E33.072, E51.022, E33.056, 257/E33.067; 313/506–509
See application file for complete search history.

(56) References Cited

U.S. PATENT DOCUMENTS

| | | | |
|---|---|---|---|
| 4,680,084 A * | 7/1987 | Heimann et al. | 216/60 |
| 4,746,792 A * | 5/1988 | Dil | 356/499 |
| 5,732,102 A * | 3/1998 | Bouadma | 372/96 |
| 5,779,924 A * | 7/1998 | Krames et al. | 216/24 |
| 6,476,550 B1 * | 11/2002 | Oda et al. | 313/504 |

(Continued)

FOREIGN PATENT DOCUMENTS

JP 11-283751 10/1999

(Continued)

OTHER PUBLICATIONS

R.H. Jordan et al., "Efficiency enhancement of microcavity organic light emitting diodes," Appl. Phys. Lett. vol. 69, No. 14, Sep. 30, 1996, pp. 1997-1999.

(Continued)

*Primary Examiner* — N Drew Richards
*Assistant Examiner* — Ankush Singal
(74) *Attorney, Agent, or Firm* — Fitzpatrick, Cella, Harper & Scinto

(57) ABSTRACT

To further improve light extraction efficiency, a light-emitting apparatus includes a cavity for resonating light emitted from a emission layer between a first reflective surface and a second reflective surface. The first reflective surface is located on a first electrode side relative to the emission layer. The second reflective surface is located on a second electrode side relative to the emission layer. A periodic structure for extracting, to outside of a light-emitting device, light which is generated from the emission layer and wave-guided in an in-plane direction of the light-emitting device between the first reflective surface and the second reflective surface is formed in the first reflective surface, or in the second reflective surface, or between the first reflective surface and the second reflective surface.

14 Claims, 7 Drawing Sheets

U.S. PATENT DOCUMENTS

| | | | |
|---|---|---|---|
| 6,630,684 B2* | 10/2003 | Lee et al. | 257/40 |
| 6,831,407 B2* | 12/2004 | Cok | 313/504 |
| 7,264,980 B2* | 9/2007 | Ozawa et al. | 438/26 |
| 7,342,246 B2* | 3/2008 | Sugiura et al. | 257/40 |
| 7,501,665 B2* | 3/2009 | Yasuda et al. | 257/98 |
| 7,538,487 B2 | 5/2009 | Hasegawa et al. | 313/504 |
| 7,671,528 B2 | 3/2010 | Fukuda et al. | 313/501 |
| 7,843,123 B2* | 11/2010 | Mizuno et al. | 313/501 |
| 2001/0003016 A1* | 6/2001 | Pan et al. | 427/569 |
| 2002/0121643 A1* | 9/2002 | Mizuno et al. | 257/98 |
| 2002/0180348 A1* | 12/2002 | Oda et al. | 313/506 |
| 2003/0057417 A1* | 3/2003 | Lee et al. | 257/40 |
| 2003/0057444 A1* | 3/2003 | Niki et al. | 257/200 |
| 2003/0143771 A1* | 7/2003 | Kidoguchi et al. | 438/46 |
| 2004/0012328 A1* | 1/2004 | Arnold et al. | 313/504 |
| 2004/0070335 A1* | 4/2004 | Cok | 313/506 |
| 2004/0252065 A1* | 12/2004 | Agnese et al. | 343/703 |
| 2005/0001227 A1* | 1/2005 | Niki et al. | 257/98 |
| 2005/0087884 A1* | 4/2005 | Stokes et al. | 257/778 |
| 2005/0088084 A1* | 4/2005 | Cok | 313/506 |
| 2005/0225232 A1* | 10/2005 | Boroson et al. | 313/504 |
| 2005/0285132 A1* | 12/2005 | Orita | 257/99 |
| 2006/0062270 A1* | 3/2006 | Okutani et al. | 372/64 |
| 2006/0171031 A1* | 8/2006 | Suzuki | 359/565 |
| 2006/0175966 A1* | 8/2006 | Yamada et al. | 313/506 |
| 2006/0192483 A1* | 8/2006 | Nakanishi et al. | 313/504 |
| 2007/0126353 A1 | 6/2007 | Kubota et al. | 313/506 |
| 2007/0129613 A1 | 6/2007 | Rochester et al. | 600/310 |
| 2007/0231503 A1* | 10/2007 | Hwang et al. | 428/1.1 |
| 2007/0236135 A1* | 10/2007 | Fukuda et al. | 313/503 |
| 2007/0257609 A1* | 11/2007 | Fukuda et al. | 313/506 |
| 2007/0290607 A1* | 12/2007 | Okada et al. | 313/504 |
| 2008/0067926 A1* | 3/2008 | Mizuno et al. | 313/504 |
| 2008/0128727 A1* | 6/2008 | Erchak et al. | 257/98 |
| 2008/0143649 A1* | 6/2008 | Asaki et al. | 345/76 |
| 2008/0185954 A1 | 8/2008 | Fukuda et al. | 313/483 |
| 2008/0303419 A1* | 12/2008 | Fukuda | 313/504 |
| 2009/0021151 A1 | 1/2009 | Fukuda | 313/504 |
| 2010/0309438 A1* | 12/2010 | Mizushima et al. | 353/31 |

FOREIGN PATENT DOCUMENTS

| | | |
|---|---|---|
| JP | 2006-269251 | 10/2006 |
| JP | 2007-234581 | 9/2007 |
| WO | WO 2005/048831 A1 | 6/2005 |
| WO | WO 2006/035596 A1 | 4/2006 |

OTHER PUBLICATIONS

M.H. Lu et al., "High-efficiency top-emitting organic light-emitting devices," Applied Physics Letters, vol. 81, No. 21, Nov. 18, 2002, pp. 3921-3923.

Huajun Pend et al., High-efficiency microcavity top-emitting organic light-emitting diodes using silber anode, Applied Physics Letters, vol. 88, 2006, pp. 073517-1 thru 073517-3.

International Preliminary Report on Patentability in PCT/JP2008/071061 dated May 27, 2010—8 pages.

* cited by examiner

FIG. 5A  FIG. 5B  FIG. 5C
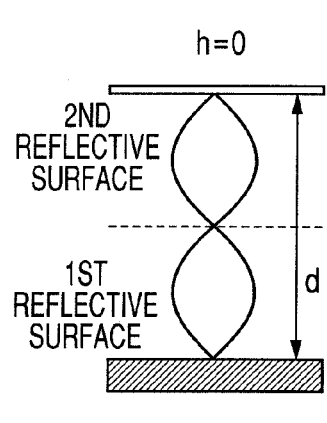
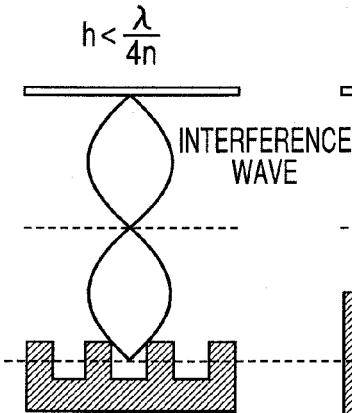
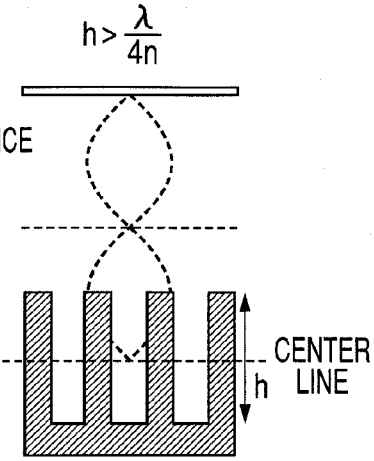
FIG. 6
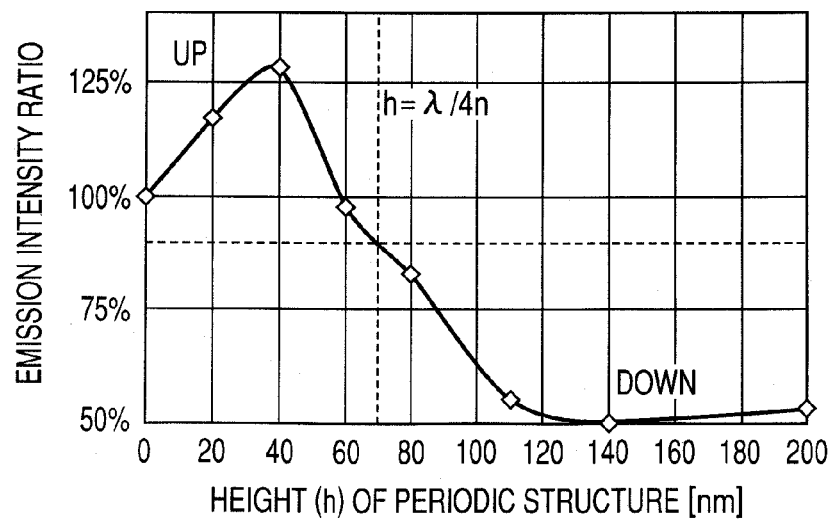

DISPLAY APPARATUS AND METHOD OF PRODUCING SAME

TECHNICAL FIELD

The present invention relates to a light-emitting apparatus.

BACKGROUND ART

An organic electroluminescent (EL) display, being a kind of light-emitting apparatus, is a new type of flat panel display and formed from an array of organic light emitting diode devices (OLEDs). In general, an OLED device is comprised of an electrode serving as the anode, an electrode serving as the cathode and several thin organic layers sandwiched between these two electrodes. The organic layers include at least one emission layer. The emission layer is formed of a fluorescent organic compound, phosphorescent organic compound or a light emitting materials such as a quantum dot (QD) to emit light at each emission color. Applying voltage to the OLED device, holes and electrons are injected from the anode and the cathode, respectively, and form excitons in the emission layer. Then these excitons recombine and release their energy as emission of light. One of the tasks to be accomplished in development of such an organic light-emitting apparatus is improvement of the emission efficiency. The OLED device generally has such a structure that an anode, an organic layer including an emission layer, and a cathode are one-dimensionally stacked. At this time, the refractive index (approximately 1.7 to 1.9) of the emission layer is larger than the refractive index of air. Therefore, most of light emitted from the inside of the emission layer is totally reflected at an interface of the stack film at which a high refractive index changes to a low refractive index. The totally reflected light becomes guided-wave light propagating in a horizontal direction of a substrate, and then is confined inside the OLED device. The ratio of light which can be extracted for use to the outside (light extraction efficiency), of light emitted in an emission layer, is generally only approximately 20%.

Therefore, in order to improve the emission efficiency of the organic light-emitting apparatus, it is important to improve the light extraction efficiency. Among conventional technologies, for example, "Appl. Phys. Lett., 69, 1997 (1996)", "Appl. Phys. Lett., 81, 3921 (2002)", and "Appl. Phys. Lett., 88, 073517 (2006)" each describe that, when a cavity is introduced into the OLED device to make use of an interference enhancing effect, the light extraction efficiency can be improved. Further, "Appl. Phys. Lett., 88, 073517 (2006)" reports that an external quantum efficiency is improved by 35% by means of a cavity.

In addition to the conventional technologies described above, for example, Japanese Patent Application Laid-Open No. H11-283751 proposes a method involving providing a periodic structure (diffraction grating) in an upper or lower portion of an organic layer (on a light extraction side or on a side opposite thereto), in order to prevent total reflection to thereby suppress light confinement inside the OLED device.

However, even in the case of the structure provided with the cavity or the structure provided with the diffraction grating, the improvement of the light extraction efficiency is insufficient. Therefore, it is necessary to further improve the light extraction efficiency. However, up to now, extensive studies have not been conducted to strike a balance between a cavity which is required to have flatness in order to generate interference light and a periodic structure which is required to have unevenness in order to generate diffraction light, thereby further improving the light extraction efficiency.

DISCLOSURE OF THE INVENTION

It is, therefore, an object of the present invention to further improve light extraction efficiency of a light-emitting apparatus.

According to the present invention, there is provided a light-emitting apparatus which includes:

a substrate;

a plurality of light-emitting devices formed on the substrate and each including:

a first electrode formed on the substrate;

a emission layer formed on the first electrode; and a second electrode formed on the emission layer;

a cavity structure for resonating light emitted from the emission layer between a first reflective surface and a second reflective surface, the first reflective surface located on the first electrode side relative to the emission layer, the second reflective surface located on the second electrode side relative to the emission layer; and a periodic structure formed in the first reflective surface, or in the second reflective surface, or between the first reflective surface and the second reflective surface.

Further features of the present invention will become apparent from the following description of exemplary embodiments with reference to the attached drawings.

BRIEF DESCRIPTION OF THE DRAWINGS

FIGS. 5A, 5B, and 5C are schematic diagrams illustrating a relationship between an interference wave in a cavity and a height of a periodic structure.

FIG. 6 is a graphical representation illustrating calculation results indicating a dependency of an emission intensity on the height of a periodic structure.

BEST MODE FOR CARRYING OUT THE INVENTION

Hereinafter, the principle of the present invention will be described with reference to structural examples.

In the present invention, in order to improve the light extraction efficiency of an OLED device (light-emitting device), a periodic structure is provided inside a cavity. The term "periodic structure" herein employed refers to a structure for extracting, to the outside of the light-emitting device, light which has been generated in a emission layer and waveguided in an in-plane direction of the light-emitting device between two reflective surfaces which constitute the cavity.

Figure 1:
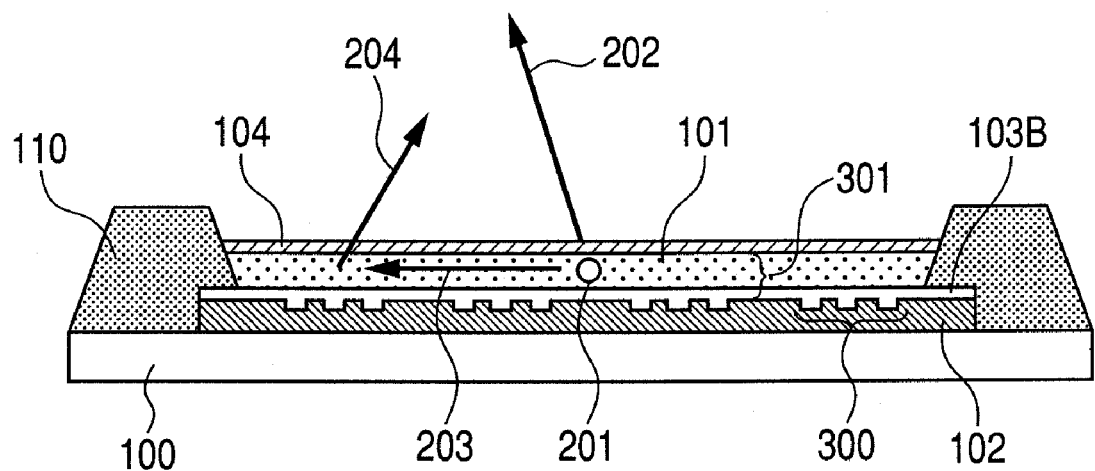
FIG. 1 is a schematic cross-sectional view illustrating an organic light-emitting apparatus having a periodic structure on a reflective surface.
Figure 2:
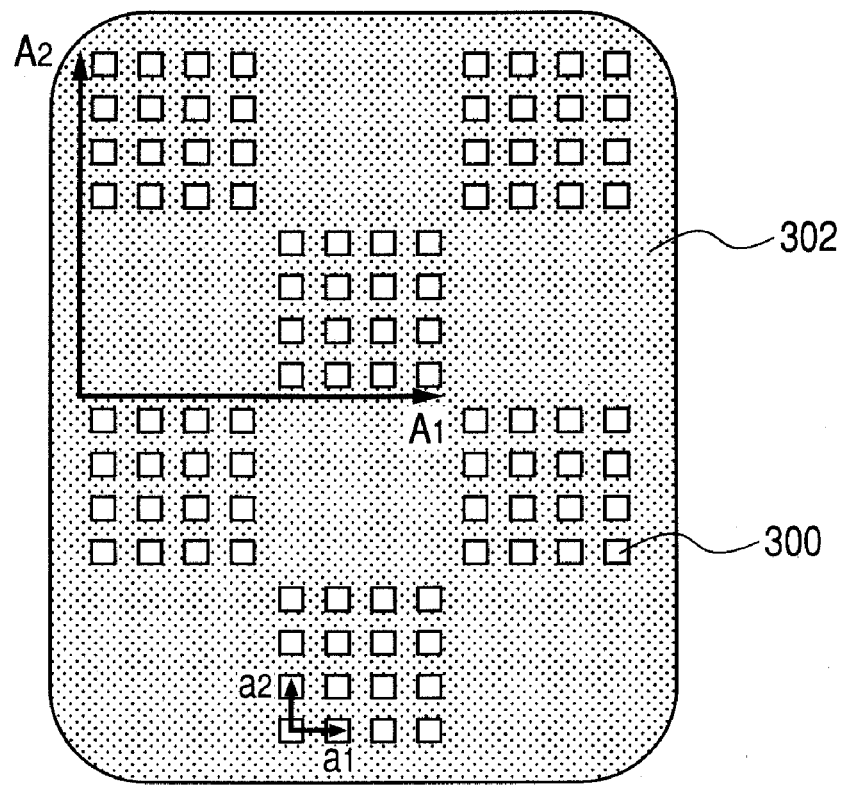
FIG. 2 is a schematic plan view illustrating the organic light-emitting apparatus having the periodic structure on the reflective surface.

FIG. 1 is a schematic cross-sectional view illustrating an organic light-emitting apparatus in which a periodic structure is provided in a cavity. FIG. 2 is a schematic plan view illustrating the organic light-emitting apparatus. Although an example of the organic light-emitting apparatus is illustrated, even in a case of an inorganic light emitting apparatus or a QD-LED apparatus, the present invention can be carried out. The organic light emitting apparatus illustrated in FIG. 1 includes a substrate 100, an organic layer 101, a reflective electrode 102, a transparent electrode 103B, a translucent metal electrode 104, a device separation film 110, and a periodic structure 300. Reference numeral 201 denotes a light emission point, 202 denotes propagating light, 203 denotes guided-wave light, and 204 denotes diffraction light. In FIG. 2, reference numeral 302 denotes an emission region.

The organic light-emitting apparatus illustrated in FIG. 1 includes an OLED device (light-emitting device). In the OLED device, the reflective electrode 102 which serves as an anode and is made of a metal is formed on the substrate 100. The reflective electrode 102 has the periodic structure 300 which is made of a metal and formed in a part of a surface on a side thereof which is opposite to the substrate 100 side. The surface of the periodic structure 300 is covered with the transparent electrode 103B located on the reflective electrode 102 so as to be planarized. A planarizing layer for planarizing the surface of the periodic structure may be not the transparent electrode 103B but a separately provided layer. In an embodiment of the present invention, the reflective electrode 102 and the transparent electrode 103B correspond to a first electrode provided on the substrate 100 side.

Further, the device separation film 110 made of an insulating material is formed so as to cover the peripheral edge of the anode. The organic layer 101 including a emission layer is stacked on a portion of the anode which is exposed through an opening portion of the device separation film 110. The translucent metal electrode 104 serving as a cathode is formed on the organic layer 101. In this embodiment, the translucent metal electrode 104 corresponds to a second electrode.

The periodic structure is a structure in which concave shapes, convex shapes, or both are periodically formed in the in-plane direction. As illustrated in FIG. 1, the concave or the convex shapes of the periodic structure are not necessarily formed into a tapered structure having a right-angled top, and thus can be formed into one of various structures such as a forward tapered structure and a reverse tapered structure. The periodic structure 300 is made of a metal and includes a photonic crystal structure (periodic structure 300) portion and a flat part which are located inside the emission region 302 as illustrated in FIG. 2. The emission region 302 illustrated in FIG. 2 corresponds to a stacked portion including the reflective electrode 102, the transparent electrode 103B, the organic layer 101, and the translucent metal electrode 104 as illustrated in FIG. 1.

Figure 3:
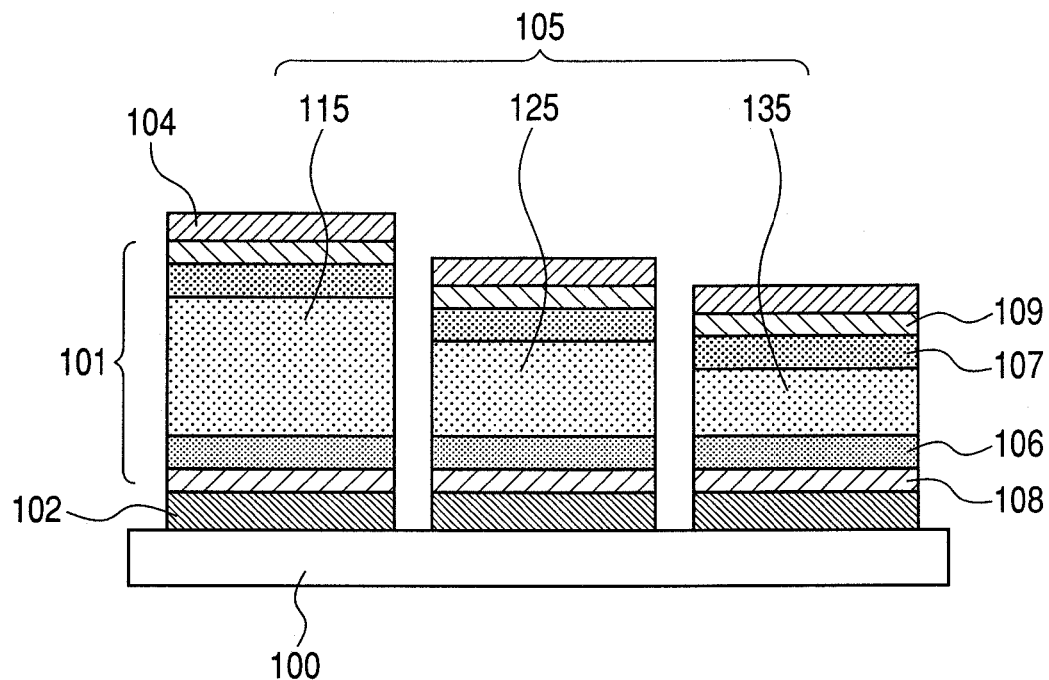
FIG. 3 is a schematic cross-sectional view illustrating an organic layer.

As illustrated in FIG. 3, the organic layer 101 normally has a structure in which a hole-transport layers 106, a emission layer 105 (including a R-emission layer 115, a G-emission layer 125, and a B-emission layer 135), and an electron-transport layer 107 are stacked. The emission layer 105 contains a fluorescent organic compound or a phosphorescent organic compound, which corresponds to its emission color. If necessary, a hole-injection layer 108 may be interposed between the anode 102 and the hole-transport layer 106, and an electron-injection layer 109 may be interposed between the cathode 104 and the electron-transport layer 107.

When a voltage is applied to the OLED device, holes injected from the anode and electrons injected from the cathode are recombined in the emission layer of the organic layer 101 to form excitons to thereby emit light.

In the structural example illustrated in FIG. 1, an interface between the reflective electrode 102 and the layer located thereon (transparent electrode 103B) corresponds to a first reflective surface, and an interface between the translucent metal electrode 104 and the layer located thereunder (organic layer) corresponds to a second reflective surface, thereby obtaining a cavity having a structure which is one-dimensional in a direction normal (or perpendicular) to the substrate. In other words, the first reflective surface is a reflective surface located on the first electrode (reflective electrode 102 and transparent electrode 103B) side relative to the emission layer 105. The second reflective surface is a reflective surface located on the second electrode (translucent metal electrode 104) side relative to the emission layer 105.

The optical path length (optical distance) between the first reflective surface and the second reflective surface of the cavity is set such that emitted lights to be extracted to the outside of the OLED device are enhanced with each other by interference. The translucent metal electrode 104 side (second electrode side) relative to the light emission point 201 is a light extraction side. The reflective electrode 102 side (first electrode side) relative to the light emission point 201 is a reflective surface side.

Figure 4:
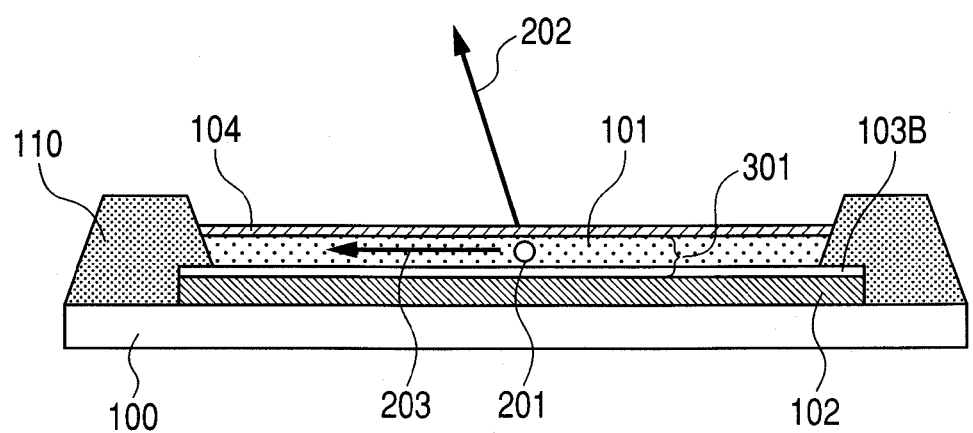
FIG. 4 is a schematic cross-sectional view illustrating an organic light-emitting apparatus having no periodic structure on a reflective surface.

The cavity also serves as a planar optical waveguide 301 in the in-plane direction of the substrate (i.e., the direction parallel to the substrate). Therefore, in a case of a normal OLED device having no periodic structure such as illustrated in FIG. 4, most of light emitted from the light emission point 201 is confined as the guided-wave light 203 traveling through the optical waveguide 301 inside the OLED device. In other words, the guided-wave light 203 is light which is waveguided in the in-plane direction of the OLED device between the first reflective surface and the second reflective surface. In contrast to this, when the periodic structure 300 such as illustrated in FIG. 1 is provided, a part of the guided-wave light 203 is converted into the diffraction light 204 by the periodic structure 300 and extracted to the outside of the OLED device, thereby further improving the light extraction efficiency.

However, as described later, even when a cavity and a periodic structure are merely combined, the cavity and the periodic structure cannot function efficiently at the same time, and hence the light extraction efficiency is not necessarily improved. The reason is as follows. The cavity is configured so as to enhance interference of light by two flat reflective surfaces. However, when the periodic structure having unevenness is disposed in the cavity, the enhancement of interference of light is impaired, which results in lowering of the light extraction efficiency.

Therefore, in order to improve the light extraction efficiency, it is necessary to strike a balance between the cavity and the periodic structure to allow them to function at the same time. To realize this, there may be included two methods. According to a first method, in order to hold the condition for interference enhancement of the cavity, the height of the periodic structure in the direction normal to the substrate is suppressed to be small, thereby striking the balance therebetween. By reducing the height of the periodic structure, even in a portion in which the periodic structure is formed, the effect of interference enhancement by means of the cavity can be obtained.

According to a second method, a portion in which a periodic structure is formed and a portion in which no periodic structure is formed are provided in a emission region of a light-emitting device. In other words, the periodic structure is provided in a part of the emission region to thereby strike the balance therebetween. In the flat portion in which no periodic structure is provided, the light extraction efficiency is improved by the interference enhancement effect of the cavity. On the other hand, in the portion in which the periodic structure is formed, the guided-wave light is converted into diffraction light to thereby improve the light extraction efficiency. Even in the portion in which the periodic structure is formed, the interference enhancement effect of the cavity can be utilized.

Therefore, according to the present invention, in the OLED device, the interference enhancement effect of the cavity and the diffraction effect of the periodic structure can be allowed to function at the same time, thereby improving the light extraction efficiency.

Hereinafter, a method of allowing the interference enhancement effect of the cavity and the diffraction effect of the periodic structure to function at the same time will be described in more detail.

(Cavity)

First, specific conditions for obtaining the interference enhancement effect of the cavity will be described.

The optical path length between the first reflective surface and the second reflective surface of the cavity is set such that the emitted lights to be extracted to the outside are enhanced with each other by interference. Assume that the peak wavelength of a spectrum of light extracted to the outside is represented by $\lambda$, the distance between the first reflective surface and the second reflective surface of the cavity is represented by "d", and an average refractive index between the first reflective surface and the second reflective surface is represented by "n", the enhancement condition of the cavity in the case of the multiple interference is expressed by Expression 1. Here, $\phi$ represents a sum of a phase shift of the first reflective surface and a phase shift of the second reflective surface, and m represent an integer. When the thickness of each layer "i" between the first reflective surface and the second reflective surface of the cavity is represented by $d_i$ and the refractive index thereof is represented by $n_i$, the distance "d" and the average refractive index "n" are expressed by "$d=\Sigma d_i$" and "$n=\Sigma n_i d_i/d$", respectively.

$$m - \frac{1}{4} < \frac{2nd}{\lambda} + \frac{\phi}{2\pi} < m + \frac{1}{4} \quad \langle\text{Expression 1}\rangle$$

The optical path length nd between the first reflective surface and the second reflective surface is desirably approximately 0.375 times to 1.375 times the peak wavelength $\lambda$ of the spectrum of light extracted to the outside. In the case of the OLED device, the average refractive index "n" between the first reflective surface and the second reflective surface is equal to approximately 1.5 to 2.0, and hence the distance "d" between the first reflective surface and the second reflective surface is desirably larger than 70 nm and smaller than 715 nm.

(Height of Periodic Structure)

Next, a configuration in which the height of the periodic structure is suppressed to be small in order to strike a balance between the cavity and the periodic structure will be described.

When the periodic structure is formed inside the cavity in order to extract, to the outside of the OLED device, the guided-wave light confined in the cavity, the optical path length will change depending on location in accordance with the unevenness of the periodic structure in the height direction, thereby affecting an interference wave in the cavity. Therefore, in order to maintain the interference enhancement condition of the cavity, it is considered that the height of the periodic structure in the direction normal to the substrate is suppressed to be small.

To describe this, FIGS. 5A to 5C are concept diagrams in a case where the periodic structure is formed in the first reflective surface of the cavity and the height "h" of the periodic structure in the direction perpendicular to the substrate is changed. As illustrated in FIG. 5C, when a change in optical path length which is caused by the unevenness of the periodic structure is too large, both the interference enhancement and interference attenuation are present, so that the interference enhancement effect of the cavity is lost.

Therefore, in order to maintain the interference enhancement of the cavity, the condition of enhancement through multiple interference of the cavity needs to be satisfied in any region of the unevenness of the periodic structure. In other words, Expression 1 needs to be satisfied in any region of the unevenness of the periodic structure, and the enhancement condition is expressed by a conditional expression of Expression 2. Further, from Expression 2, the condition to be satisfied by the height "h" of the periodic structure is expressed by Expression 3. Thus, in order to maintain the interference enhancement of the cavity, the height h of the periodic structure needs to be suppressed to be smaller than an upper limit value $\lambda/(4n)$. In FIGS. 5A to 5C, when the height of the periodic structure is smaller than the upper limit value $\lambda/(4n)$, the interference enhancement effect of the cavity is maintained (FIG. 5B). In contrast to this, when the height of the periodic structure exceeds the upper limit value $\lambda/(4n)$, the interference enhancement effect of the cavity is lost (FIG. 5C).

$$m - \frac{1}{4} < \frac{2n\left(d - \frac{h}{2}\right)}{\lambda} + \frac{\phi}{2\pi} < \frac{2n\left(d + \frac{h}{2}\right)}{\lambda} + \frac{\phi}{2\pi} < m + \frac{1}{4} \qquad \text{⟨Expression 2⟩}$$

$$h < \frac{\lambda}{4n} \qquad \text{⟨Expression 3⟩}$$

In the case of the OLED device, the average refractive index "n" is equal to approximately 1.5 to 2.0 and the emission wavelength λ in the visible region is 380 nm to 780 nm, and hence the height of the periodic structure is desirably smaller than 130 nm. Moreover, when a red-light-emitting device, a green-light-emitting device, and a blue-light-emitting device (hereinafter referred to as R-device, G-device, and B-device, respectively) have the same periodic structure height, since it is necessary to satisfy the condition expressed by Expression 3 in the blue (B) case where the wavelength is shortest, the height of the periodic structure is desirably smaller than 60 nm. When the R-device, the G-device, and the B-device have the same periodic structure height, the periodic structure therefor can be formed at the same time. In order to prevent a step disconnection of the emission layer to thereby prevent current leakage or nonuniform light emission, it is required to planarize the emission layer. In order to planarize the emission layer, the height of the periodic structure is more desirably smaller than 30 nm. In particular, the OLED device has a significant problem such as current leakage or nonuniform light emission due to step disconnection of the organic layer (emission layer). Therefore, it is desirable to reduce the height of the periodic structure.

The periodic structure is desirably formed on the substrate side relative to the emission layer, that is, between the emission layer and the substrate. This reason is as follows. When the periodic structure is formed on the light extraction side of the emission layer, although the problem caused by the step disconnection of the emission layer is resolved, it is difficult to form the periodic structure without affecting the emission layer (organic layer).

On the other hand, in order to increase coupling efficiency between the guided-wave light and the diffraction light to thereby improve the diffraction effect of the periodic structure, it is desirable to increase a change in dielectric constant of the optical waveguide, which is caused by the periodic structure. Since it is necessary to suppress the height of the periodic structure according to Expression 3, the volume of the periodic structure is limited. Therefore, in order to increase the change in dielectric constant, the periodic structure is desirably made of a material which is significantly different in dielectric constant from a material of the organic layer or the transparent conductive layer (transparent electrode). Therefore, the periodic structure is desirably made of a metal layer. Further, it is also desirable to form the periodic structure in the reflective interface (surface) which constitutes the cavity. The reason is that since the periodic structure can be formed together with the formation of the layer constituting the reflective surface, it is unnecessary to provide an additional layer for forming the periodic structure.

Therefore, in the case of an OLED device including a cavity, by constituting a periodic structure made of a metal layer inside the cavity, the interference enhancement effect of the cavity and the diffraction effect of the periodic structure can be allowed to function at the same time, thereby improving the light extraction efficiency.

Hereinafter, a specific evaluation example will be described. FIG. 6 is a graph illustrating a result obtained by evaluating a relationship between the height of a periodic structure made of a metal layer and an emission intensity by numerical calculation. The emission intensity is a relative value in a case where the height of the periodic structure is 0, and indicates a change in light extraction efficiency. As illustrated in FIGS. 5B and 5C, the periodic structure is assumed to be provided on the entire first reflective surface. While the distance "d" between a center line of the height "h" of the periodic structure and the second reflective surface was held constant, the height "h" of the periodic structure was changed. A finite difference time domain (FDTD) method was used for numerical calculation of electromagnetic waves in view of a cross section of the organic light-emitting apparatus. The calculation was performed at a wavelength range (λ) of 380 nm to 780 nm at intervals of 5 nm. The calculation was performed with the electromagnetic wave mode being set to TE and TM modes.

In the evaluation example illustrated in FIG. 6, the peak wavelength λ of the spectrum of light extracted to the outside is approximately 530 nm and the average refractive index "n" between the first reflective surface and the second reflective surface of the cavity is approximately 1.9, with the result that the upper limit value λ/(4n) of the height "h" of the periodic structure is approximately 70 nm.

According to the graph of the result obtained by evaluation as illustrated in FIG. 6, it can be seen as follows. While the height of the periodic structure made of metal is gradually increased, the emission intensity increases. Then, the emission intensity becomes maximum in the vicinity of a height of 40 nm. After that, the emission intensity is reduced, and at a height of the periodic structure close to the upper limit value of 70 nm, the curve has an inflection point. When the height of the periodic structure becomes larger than the upper limit value of 70 nm, the emission intensity continues to be reduced. Finally, the emission intensity is reduced to approximately 50% of an emission intensity in the case where no periodic structure is provided.

(Partial Formation of Periodic Structure)

Next, a configuration in which a periodic structure is provided in a part of a emission region in order to strike a balance between a cavity and the periodic structure will be described. Also in the case where the periodic structure is provided in a part of the emission region, the cavity and the periodic structure can be allowed to function at the same time to thereby improve the light extraction efficiency.

In the structural example illustrated in FIG. 2, the emission region includes a portion in which the periodic structure 300 is provided and a portion in which no periodic structure is provided. Here, it is assumed that two primitive lattice vactors for specifying the period of the periodic structure 300 are represented by $a_1$ and $a_2$. Further, it is also assumed that primitive reciprocal lattice vactors satisfying a relationship of Expression 4 with respect to the primitive lattice vactors $a_1$ and $a_2$ are represented by $b_1$ and $b_2$.

When the periodic structure is to be provided in a part of the emission region, it is desirable that a portion in which the periodic structure is formed and a portion in which no periodic structure is formed and the flatness of the cavity is maintained are alternately provided in the cavity. The example of FIG. 2 illustrates the layered structure in which the portion in which the periodic structure 300 is provided and the portion in which no periodic structure is provided are arranged at a larger period. Two primitive lattice vectors for specifying the larger period are represented by $A_1$ and $A_2$. In the case of FIG. 2, the periodic structure 300 has a four-fold symmetry so as to have the same viewing angle characteristics in the up and down direction and the right and left direction of the light-emitting device. In the case where the light-emitting device according to the present invention is used in a display apparatus, primitive lattice vector directions of the periodic structure are desirably caused to correspond to the up and down direction and the right and left direction of the display region so that the viewing angle characteristics are the same in the up and down direction and the right and left direction of the display apparatus.

$$a_i \cdot b_j = 2\pi \delta_{ij}, (i,j=1,2) \qquad \text{<Expression 4>}$$

In FIG. 1, a distance (half distance) necessary to reduce the intensity of the guided-wave light 203 by half because of attenuation is approximately 10 μm. Therefore, in order that light which has been emitted in a portion in which the periodic structure 300 is not provided reaches the periodic structure 300 and is extracted to the outside of the device to thereby improve the light extraction efficiency, it is desirable that a distance between any position in the emission region and a periodic structure located closest to the position is less than 10 μm.

Figure 7:
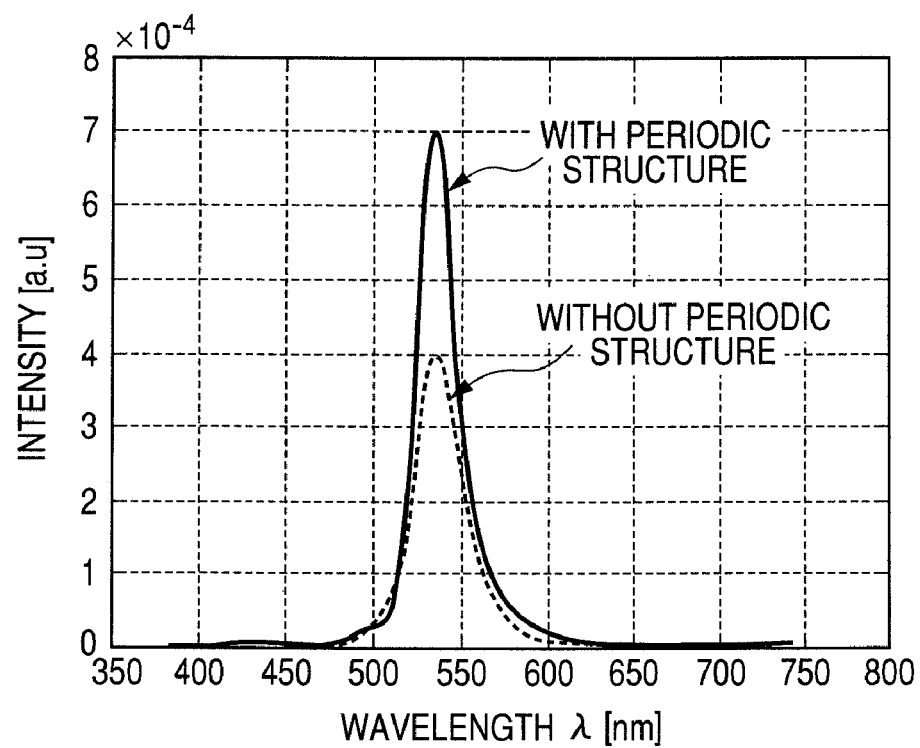
FIG. 7 is a graphical representation illustrating calculation results indicating EL spectrums of the organic light-emitting apparatus having a periodic structure on a reflective surface and the organic light-emitting apparatus having no periodic structure on a reflective surface.

FIG. 7 is a graph illustrating emission spectrums obtained by evaluation using numerical calculation in the structural example of the present invention (FIGS. 1 and 2: periodic structure and cavity are provided) and the conventional example (FIG. 4: periodic structure is not provided and cavity is provided). It can be seen from FIG. 7 that the peak intensity in the structural example of the present invention is approximately 1.8 times the peak intensity in the conventional example, and that the light extraction efficiency is improved.

(Period of Periodic Structure)

In order to enhance the diffraction effect owing to the periodic structure, it is more desirable that the period of the periodic structure is appropriately set. Hereinafter, the period of the periodic structure will be described.

It is assumed that the emission peak wavelength of the emission layer of the organic layer 101 is represented by λ and the wave number is represented by "$k=2\pi/\lambda$". Further, it is also assumed that the refractive index of the emission layer is represented by "n", the refractive index of a medium (air in general) located on the light extraction side is represented by $n_{ext}$, and a relationship of $n > n_{ext}$ is satisfied.

The propagation coefficient in the direction parallel to the substrate 100 with respect to the guided-wave light 203 propagating through the optical waveguide 301 is represented by β, and the effective refractive index $n_{eff}$ and the effective absorption coefficient $\kappa_{eff}$ with respect to the guided-wave light 203 are defined by Expression 5. The effective refractive index $n_{eff}$ satisfies a condition of $n_{ext} < n_{eff} < n$.

$$\beta = (n_{eff} + i\kappa_{eff})k \qquad \text{<Expression 5>}$$

At this time, the diffraction condition is obtained by Expression 6 based on a phase matching condition in the horizontal direction under the condition of $n_{ext} < n_{eff} < n$ on the assumption that two integers $m_1$ and $m_2$ denote diffraction orders and θ denotes a diffraction angle relative to the direction normal to the substrate.

$$n_{eff} - n_{ext}\sin\theta = \frac{\lambda}{2\pi}|m_1 b_1 + m_2 b_2| \qquad \text{<Expression 6>}$$

In the case of a square grating, when the period is expressed by "a", the primitive lattice vactors are obtained by Expression 7 and the primitive reciprocal lattice vactors are obtained by Expression 8.

$$a_1 = \begin{pmatrix} a \\ 0 \end{pmatrix}, a_2 = \begin{pmatrix} 0 \\ a \end{pmatrix} \qquad \text{<Expression 7>}$$

$$b_1 = \frac{2\pi}{a}\begin{pmatrix} 1 \\ 0 \end{pmatrix}, b_2 = \frac{2\pi}{a}\begin{pmatrix} 0 \\ 1 \end{pmatrix} \qquad \text{<Expression 8>}$$

At this time, the diffraction condition of Expression 6 is expressed by Expression 9.

$$n_{eff} - n_{ext}\sin\theta = \frac{\sqrt{m_1^2 + m_2^2}}{a}\lambda \qquad \text{<Expression 9>}$$

Here, attention is focused on any one of the one-dimensional directions, and it is assumed that $m_2=0$ (or $m_1=0$) and $|m_1|=m>0$ ($|m_2|=m>0$). At this time, the diffraction condition of Expression 9 is simplified to Expression 10. Further, as in the case of the OLED device, when the relationship of $3n_{ext} > n \geq n_{eff}$ is satisfied, the diffraction condition for generating only a primary diffraction light of m=1 is represented by Expression 11.

$$n_{eff} - n_{ext}\sin\theta = m\frac{\lambda}{a} \qquad \text{<Expression 10>}$$

$$\frac{\lambda}{n + n_{ext}} < a < \frac{\lambda}{n_{ext}} \qquad \text{<Expression 11>}$$

In order to enable a light emission pattern, efficiency, and chromaticity of the OLED device to be controlled, it is desirable to generate only primary diffraction light and to reduce the number of modes of the guided-wave light. In the case of the OLED device, the refractive index "n" of the emission layer is approximately 1.6 to 2.0 and the refractive index $n_{ext}$ of the medium located on the light extraction side is 1.0. Therefore, from Expression 11, when only the primary diffraction light is mainly used, the period "a" of the periodic structure 300 is desirably substantially 0.33 times to 1.0 times the emission peak wavelength λ. Since the visible light wavelength region is 380 nm to 780 nm, the period "a" of the periodic structure 300 is desirably more than 125 nm and less than 780 nm. In order that the period of the periodic structure satisfy Expression 11 in each of the R-device, the G-device, and the B-device, the period is desirably made to be the largest in the R-device of the devices for the three colors, and the smallest in the B-device of the devices for the three colors.

(Other Structure)

The foregoing description has been made by taking, as an example, a structure in which the anode is located on the substrate side and the cathode is located on the light extraction side. However, even in a case of a structure in which the cathode is located on the substrate side, the anode is located on the light extraction side, and the hole-transport layer, the emission layer, and the electron-transport layer are stacked in the reverse order, the present invention can be carried out. Therefore, the light-emitting apparatus according to the present invention is not limited to the structure in which the anode is located on the substrate side and the cathode is located on the light extraction side.

As the organic compound for use in each of the hole-transport layer 106, the emission layer 105, the electron-transport layer 107, the hole-injection layer 108, and the electron-injection layer 109 as illustrated in FIG. 3, a lowmolecular material, a polymer material, or a combination thereof is used. Therefore, the organic compound is not particularly limited. If necessary, an inorganic compound or a QD (quantum dot) may also be used.

Figure 8:
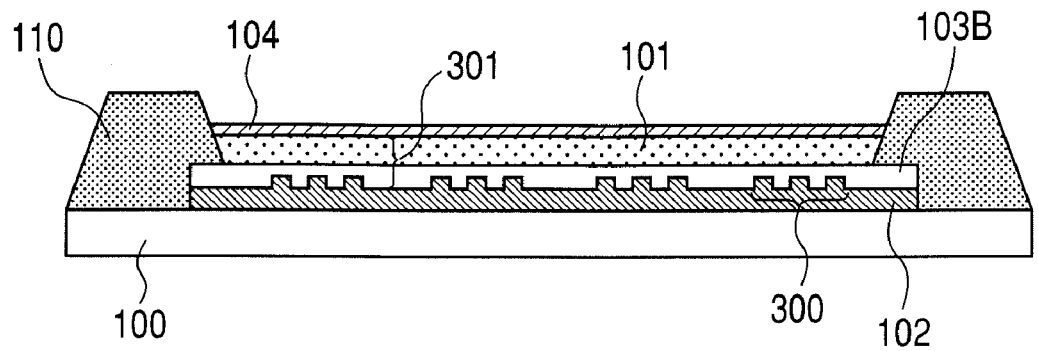
FIG. 8 is a schematic cross-sectional view illustrating an organic light-emitting apparatus having a protruding periodic structure on a reflective surface.
Figure 9:
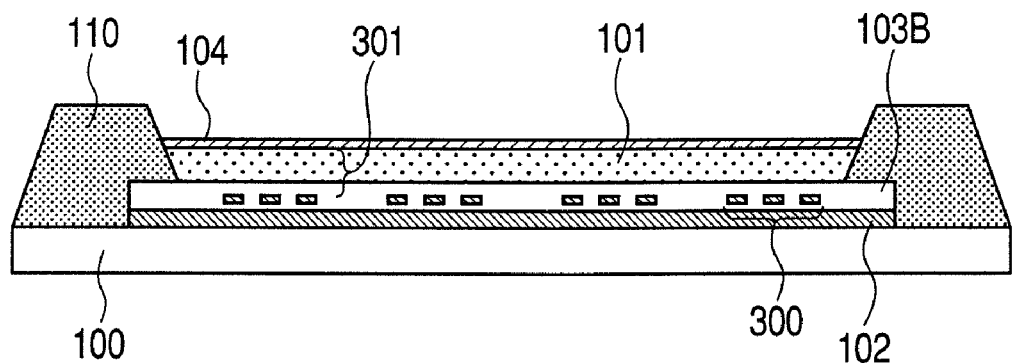
FIG. 9 is a schematic cross-sectional view illustrating an organic light-emitting apparatus having a periodic structure between two reflective surfaces.

Further, the periodic structure 300 is not limited to the two-dimensional photonic crystal structure as described above, and may be a combination of one-dimensional diffraction gratings or a three-dimensional photonic crystal structure. Although a recessed photonic crystal structure is illustrated in FIG. 1, a protruding photonic crystal structure such as illustrated in FIG. 8 may also be used. Moreover, as illustrated in FIG. 9, the periodic structure may be provided at a location apart from a reflective interface.

Figure 10:
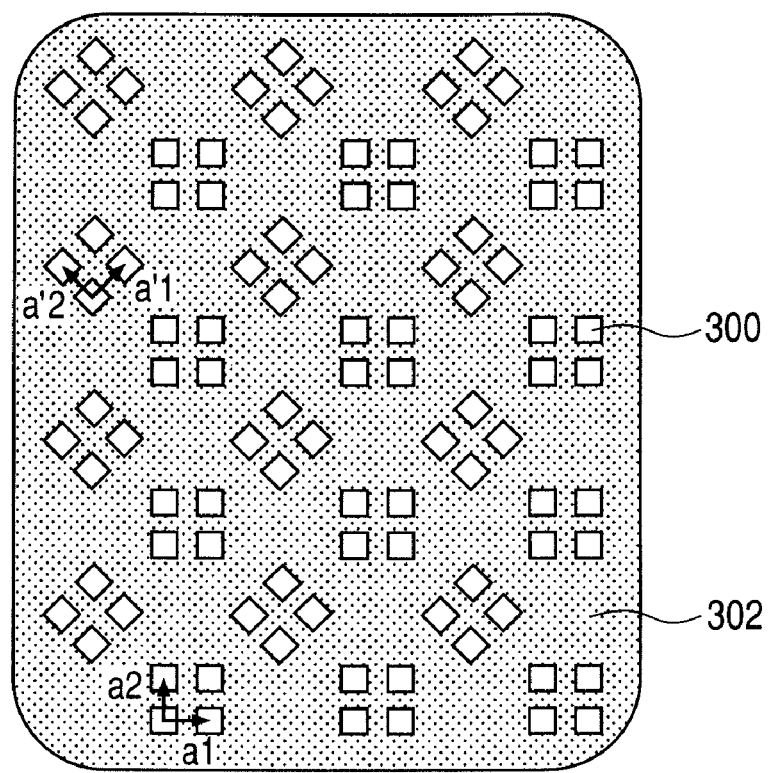
FIG. 10 is a schematic plan view illustrating an organic light-emitting apparatus having a periodic structure on a reflective surface.

Moreover, as illustrated in FIG. 10, a structure including all of plural kinds of periodic structures 300 with different primitive lattice vectors may be used. FIG. 10 illustrates an example in which a periodic structure having primitive lattice vectors $a_1$ and $a_2$ and a periodic structure having primitive lattice vectors $a'_1$ and $a'_2$ are combined. It is to be noted that $a'_1$ denotes a vector in a $(a_1+a_2)/\sqrt{2}$ direction and $a'_2$ denotes a vector in a $(-a_1+a_2)/\sqrt{2}$ direction. In other words, periodic structure-2 having a four-fold symmetry and periodic structure-2 obtained by rotating the periodic structure-1 by 45° are combined. When the periodic structures are arranged as illustrated in FIG. 10, not only the viewing angle characteristics of the light-emitting device in the up and down direction and the right and left direction but also the viewing angle characteristics of the light-emitting device in oblique directions can be made equal to one another. similarly, when N denotes a natural number, periodic structure-1 having an N-fold symmetry and periodic structure-2 obtained by rotating the periodic structure-1 by 180°/N can be combined.

The periodic structure 300 is not necessarily completely periodic and thus may be a quasi-crystalline structure, a fractal structure, a structure whose period continuously changes, a structure including a partially irregular scattering structure, or a combination of a periodic structure and any one of these structures.

Moreover, the foregoing description has been made by taking, as an example, a structure in which the electrode located on the substrate side, that is, the first electrode is a two-layer electrode including the reflective electrode and the transparent electrode. However, even in a structure in which either one of the reflective electrode and the transparent electrode is used as the first electrode, the present invention can be carried out. When the transparent electrode is used as the first electrode, a reflective layer constituted of a metal layer is desirably provided in contact with or apart from the substrate. The reflective layer corresponds to the first reflective surface.

Figure 11:
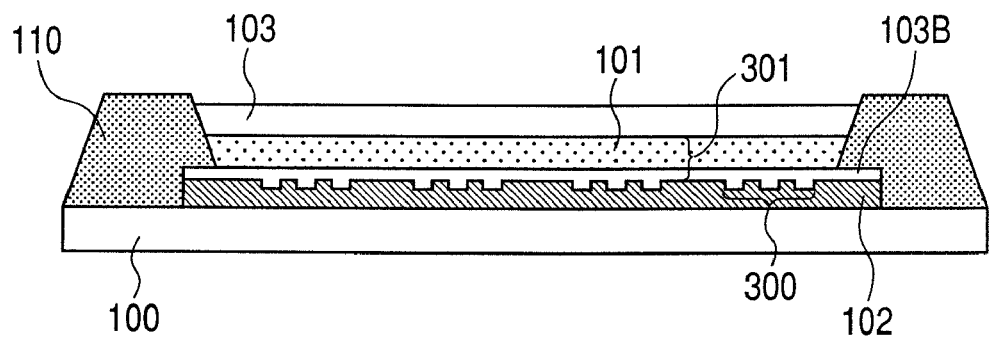
FIG. 11 is a schematic cross-sectional view illustrating an organic light-emitting apparatus having a periodic structure on a reflective surface.
Figure 12:
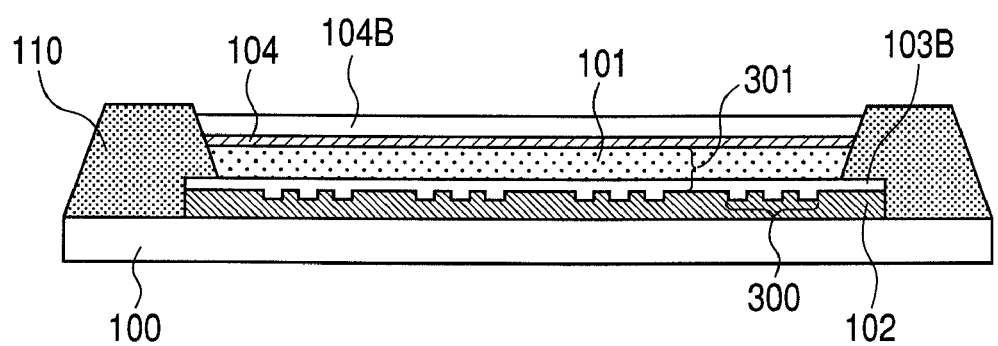
FIG. 12 is a schematic cross-sectional view illustrating an organic light-emitting apparatus which has a periodic structure on a reflective surface and has a translucent electrode including a plurality of layers on a light extraction side thereof.

The above description has been made by taking, as an example, a structure in which the electrode located on the light extraction side, that is, the second electrode is a translucent metal electrode. However, as illustrated in FIG. 11, even in a case of a structure in which the electrode located on the light extraction side is a transparent electrode (light transmission electrode) 103, the present invention can be carried out. In this case, an interface between the transparent electrode 103 and air adjacent thereto is used as the second reflective surface. Moreover, as illustrated in FIG. 12, a dielectric layer 104B may be formed on the translucent metal electrode 104 in FIG. 1 or on the transparent electrode 103 in FIG. 11. Alternatively, a multilayer interference film including at least tow or all of a metal layer, a transparent electrode layer, and a dielectric layer can be also provided for one of the first reflective surface and the second reflective surface, which is located on the light extraction side.

Figure 13:
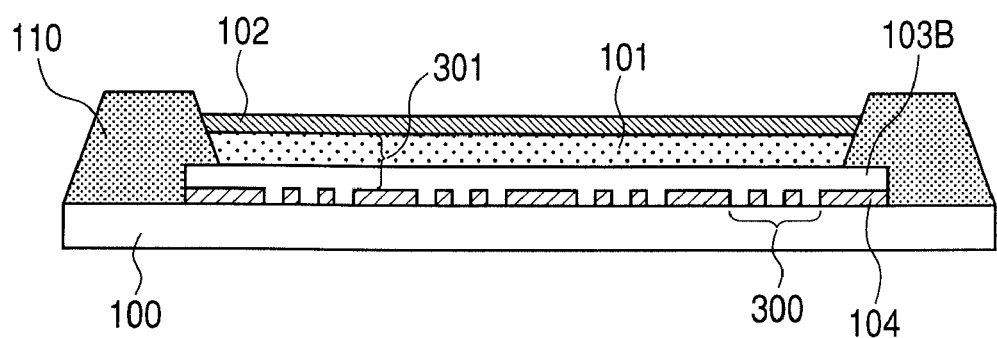
FIG. 13 is a schematic cross-sectional view illustrating a bottom-emission organic light-emitting apparatus having a periodic structure on a reflective surface.

Moreover, the above description has been made by taking, as an example, the top-emission structure in which the side opposite to the substrate side is the light extraction side. However, even in a case of a bottom-emission structure in which the substrate side is the light extraction side, the present invention can be carried out. FIG. 13 illustrates an example in which the periodic structure is formed in a reflective surface located on the substrate side relative to the emission layer. That is, in the bottom-emission structure, a translucent metal electrode 104 having a periodic structure 300 and a transparent electrode 103B located on the translucent electrode are formed on a substrate 100, and an organic layer 101 and a reflective electrode 102 are stacked on the transparent electrode 103B.

Further, in FIG. 1, surface plasmon is generated which propagates in the direction parallel to the substrate through an interface (metal reflective surface) between the reflective electrode 102 made of metal and the transparent electrode 103B which is deemed to be a dielectric in the visible light wavelength region and located on the reflective electrode, and which may be considered as a kind of guided-wave light. Therefore, the interface between the reflective electrode 102 and the transparent electrode 103B located on the reflective electrode can be used as an optical waveguide. When the propagation coefficient $\beta_{sp}$ of the surface plasmon is set as the propagation coefficient $\beta$ of Expression 5, the diffraction condition is expressed by Expression 6 as is the case with normal guided-wave light. The interface at which surface plasmon is generated is not limited to an interface between a metal and a transparent electrode, but also includes an interface between a metal and an organic layer or an interface between a metal and a dielectric layer.

The light-emitting apparatus according to the present invention can be applied to various uses for a display apparatus, lighting, back lighting for a display apparatus, and the like. The display apparatus includes a television receiver, a display of a personal computer, a back display part of an imaging device, a display part of a mobile phone, a display part of a portable audio player, a display part of a personal digital assistant (PDA), a display part of a portable game machine, and a display part of a car navigation system.

EXAMPLES

Hereinafter, production of the light-emitting apparatus according to the present invention will be described using examples, but the present invention is not limited by the examples described below.

Example 1

Figure 14:
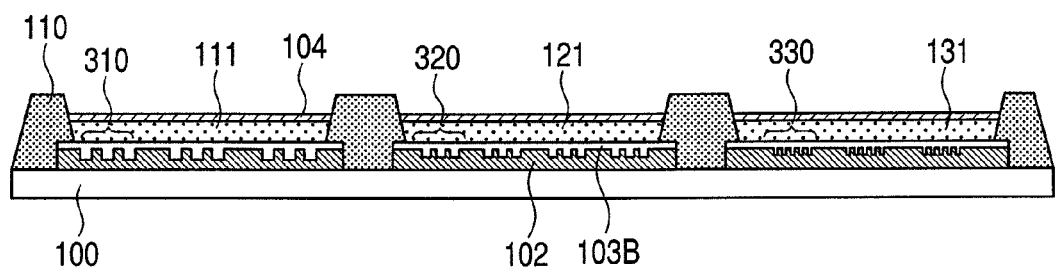
FIG. 14 is a schematic cross-sectional view illustrating an organic light-emitting apparatus which is a discrete RGB pixelation type and have a periodic structure on a reflective surface.

A full-color organic light emitting apparatus having a structure illustrated in FIG. 14 is produced by the following procedure. In other words, the light-emitting apparatus according to Example 1 of the present invention is an organic light emitting apparatus which includes a plurality of pixels each having an R-device, a G-device, and a B-device, that is, subpixels of three colors including red, green, and blue and can be desirably applied as a display apparatus.

First, a TFT drive circuit constituted of low temperature polysilicon is formed on a glass substrate serving as a support member, and a planarizing film made of an acrylic resin is formed thereon, thereby obtaining the substrate 100. An Ag alloy film having a thickness of approximately 150 nm is formed as the reflective electrode 102 on the substrate 100 by sputtering. The reflective electrode 102 made of Ag alloy is a high-reflective electrode whose spectral reflectance is 80% or more in the visible light wavelength region (λ=380 nm to 780 nm). Further, for example, an Al alloy may be used instead of the Ag alloy.

A positive resist is spin-coated on the reflective electrode 102 and then pre-baked. After that, a periodic structure pattern of the square grating such as illustrated in FIG. 2 is exposed on the resist, developed, and post-baked to form a patterned resist.

The periodic structure 300 is formed in the surface of the reflective electrode 102 by etching processing. In Example 1 of the present invention, the periodic structure of the R-device (R-periodic structure 310) has a period of 345 nm, a side length of 200 nm, and an etching depth of 40 nm. The periodic structure of the G-device (G-periodic structure 320) has a period of 250 nm, a side length of 140 nm, and an etching depth of 40 nm. The periodic structure of the B-device (B-periodic structure 330) has a period of 200 nm, a side length of 145 nm, and an etching depth of 40 nm. In each of the R-, G-, and B-periodic structures, a portion in which the periodic structure 300 is provided and a flat portion are alternatively arranged at every ten periods.

Next, the etched portion of the periodic structure 300 which is recessed is planarized by an IZO lift-off process. In a state where the patterned resist is left, an IZO film as a transparent conductive material is formed in a thickness of 40 nm by sputtering. In the etched portion, the IZO film is formed on the Ag alloy film, while in a portion except the etched portion, the IZO film is formed on the patterned resist. Then, the resist is stripped to remove the IZO on the resist together, thereby performing planarization. After that, an IZO film is formed on the resultant glass substrate in a thickness of 20 nm by sputtering, followed by electrode patterning to form an anode with a photonic crystal.

In the square grating such as illustrated in FIG. 2, the periods (arrangements) of the periodic structure 310 (320, 330) of respective subpixels in the up and down direction and the right and left direction are equal to each other. Therefore, when the light-emitting apparatus is visually observed, the same optical characteristics can be obtained in the up and down directions and the right and left directions to thereby improve the visibility. Alternatively, a rectangular grating whose periods in the up and down direction and the right and left direction are different from each other may be used. In this case, the visibility can be adjusted according to the direction. Further, when different type square gratings are combined such as illustrated in FIG. 10, the same optical characteristics can be obtained in the up and down direction, the right and left direction, and the oblique directions to thereby improve the visibility.

The device separation film 110 made of silicon oxynitride ($SiN_xO_y$) is formed at a thickness of 320 nm. Then, an opening serving as the EL region is formed for each subpixel by etching to produce an anode substrate in which photonic crystals are arranged.

The anode substrate is ultrasonically cleaned with isopropyl alcohol (IPA), washed with boiled water, and then dried. After that, the substrate is cleaned with UV/ozone and organic layers 111, 121, and 131 are formed for R, G, and B by vacuum evaporation.

First, a film of Compound 1 represented by the following structural formula is formed for respective subpixels using a shadow mask. An R-hole-transport layer is formed in a thickness of 215 nm. A G-hole-transport layer is formed in a thickness of 155 nm. A B-hole-transport layer is formed in a thickness of 105 nm. In this case, the degree of vacuum is $1\times10^{-4}$ Pa and the evaporation rate is 0.2 nm/sec.

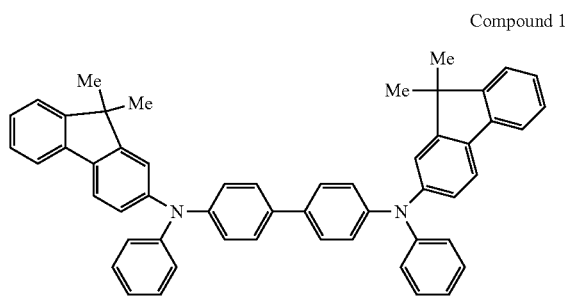

Compound 1

Next, R-, G-, and B-emission layers are respectively formed using a shadow mask. The R-emission layer is formed in a thickness of 30 nm by coevaporation using 4,4'-bis(N-carbazole) biphenyl (hereinafter referred to as CBP) as a host and phosphorescent compound bis[2-(2'-benzothienyl) pyridinato-N, C3] (acetylacetonato) iridium (hereinafter referred to as Btp2Ir(acac)). The G-emission layer is formed in a thickness of 30 nm by coevaporation using tris-(8-hydroxyquinoline) aluminum (hereinafter referred to as Alq3) as a host and light-emitting compound 3-(2'-benzothiazolyl)-7-N,N-diethylaminocoumarin (hereinafter referred to as coumarin-6). The B-emission layer is formed in a thickness of 30 nm by coevaporation using Compound 2 represented by the following structural formula as a host and light-emitting Compound 3 represented by the following structural formula. The degree of vacuum during evaporation is $1\times10^{-4}$ Pa and the film formation rate is 0.2 nm/sec.

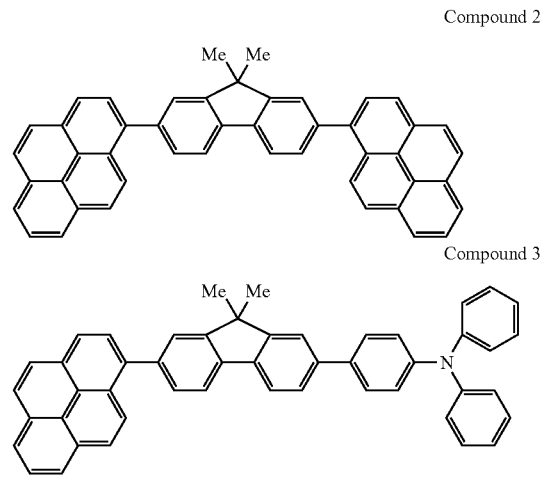

Compound 2

Compound 3

Then, an electron-transport layer common to the R-, G-, and B-devices is integrally formed in a thickness of 10 nm by vacuum evaporation using 1,10-bathophenanthroline (hereinafter referred to as BPhen). The degree of vacuum during evaporation is $1\times10^{-4}$ Pa and the film formation rate is 0.2 nm/sec. Then, an electron-injection layer common to the R-, G-, and B-devices is integrally formed in a thickness of 30 nm by coevaporation using BPhen and $Cs_2CO_3$ (weight ratio of 90:10). The degree of vacuum during evaporation is $3\times10^{-4}$ Pa and the film formation rate is 0.2 nm/sec.

After the formation of the electron-injection layer, the resultant substrate is transferred into a sputtering apparatus without breaking vacuum, and an Ag alloy film having a thickness of 24 nm is formed as the translucent metal electrode 104 by sputtering.

Then, as illustrated in FIG. 12, a silica film having a thickness of 290 nm is formed as the dielectric layer 104B by sputtering.

Further, a desiccant is provided in the peripheral part of the light-emitting apparatus, followed by sealing with etched cap glass to obtain the organic light emitting apparatus.

Example 2

The procedure up to and including the formation of the resist patter in Example 1 is followed.

Then, as illustrated in FIG. 8, the periodic structure 300 which protrudes upward is formed in the surface of the reflective electrode 102 by a lift-off process. An Ag alloy film is formed in a thickness of 20 nm by sputtering. In the exposed portion of the positive resist, the Ag alloy film is formed on the reflective electrode 102, while in a portion except the exposed portion of the positive resist, the Ag alloy film is formed on the resist. Then, the resist is stripped to remove the Ag alloy on the resist together, thereby forming the periodic structure 300 which protrudes upward.

In Example 2, the R-periodic structure 310 has a period of 345 nm, a side length of 200 nm, and a depth of 20 nm. The G-periodic structure 320 has a period of 250 nm, a side length of 140 nm, and a depth of 20 nm. The B-periodic structure 330 has a period of 200 nm, a side length of 145 nm, and a depth of 20 nm. In each of the R-, G-, and B-periodic structures, the portion in which the periodic structure 300 is provided and the flat portion are alternatively arranged at every ten periods.

Next, the patterned resist is removed by a remover. An IZO film made of a transparent conductive material is formed in a thickness of 80 nm by sputtering. Then, electrode patterning is performed to form an anode with a photonic crystal. The height of the periodic structure 300 located on the reflective electrode is decreased and the thickness of the transparent electrode 103B located on the reflective electrode is increased, thereby improving the flatness.

Further, the device separation film 110 made of silicon oxynitride ($SiN_xO_y$) is formed in a thickness of 320 nm. Then, an opening serving as the EL region is formed for each subpixel by etching to produce an anode substrate in which photonic crystals are arranged.

The anode substrate is ultrasonically cleaned with isopropyl alcohol (IPA), washed with boiled water, and then dried. After that, the substrate was cleaned with UV/ozone and organic layers 111, 121, and 131 are formed for R, G, and B by vacuum evaporation.

The film of Compound 1 is formed for respective subpixels using a shadow mask. The R-hole-transport layer is formed in a thickness of 150 nm. The G-hole-transport layer is formed in a thickness of 90 nm. The B-hole-transport layer is formed in a thickness of 40 nm. In this case, the degree of vacuum is $1 \times 10^{-4}$ Pa and the evaporation rate is 0.2 nm/sec. The same procedure as in Example 1 is followed between the formation of the emission layer and the formation of the electron-injection layer.

After the formation of the electron-injection layer, the resultant substrate is transferred into a sputtering apparatus without breaking vacuum, and an Ag alloy film having a thickness of 20 nm is formed as the metal translucent electrode 104 by sputtering.

Then, as illustrated in FIG. 12, a silica film having a thickness of 70 nm is formed as the dielectric layer 104B by sputtering.

Further, a desiccant is provided in a peripheral part of the light-emitting apparatus, followed by sealing with etched cap glass to obtain the organic light emitting apparatus.

Example 3

The procedure up to and including the formation of the periodic structure 300 which protrudes upward in Example 2 is followed. Then, the patterned resist is removed by a remover. Next, an SOG film is formed in a thickness of 30 nm by spin coating to effect planarization. Then, an IZO film made of a transparent conductive material is formed in a thickness of 60 nm by sputtering, and then electrode patterning is performed to form an anode with a photonic crystal. Thereafter, the procedure including and subsequent to the formation of the electron-transport layer in Example 2 is followed. Thereby, a structure having the planarizing layer for planarizing the periodic structures is provided.

Example 4

Figure 15:
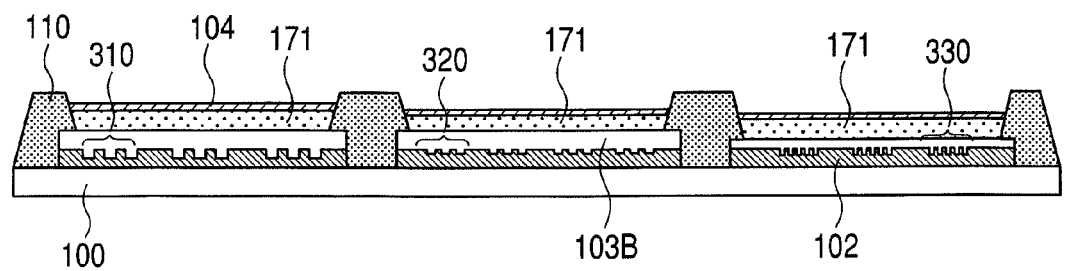
FIG. 15 is a schematic cross-sectional view illustrating an organic light-emitting apparatus which is a white common layer type and having a periodic structure on a reflective surface.

FIG. 15 is a structural view illustrating an organic light emitting apparatus according to Example 4. The procedure up to and including the formation of the hole-transport layer in Example 1 is followed. A common three-color stack type white (W) emission layer is formed to have the following stack structure. A layer is formed in a thickness of 25 nm by coevaporation using CBP and bis[(4,6-difluorophenyl) pyridinato-N, C2] (picolinato) iridium (hereinafter referred to as Flrpic) (weight ratio of 94:6). Then, a layer is formed in a thickness of 2 nm by coevaporation using CBP and Btp2Ir (acac) (weight ratio of 92:8). Then, a layer is formed in a thickness of 2 nm by coevaporation using CBP and bis(2-phenylbenzothiozolato-N-C2) iridium(acetylacetonate) (hereinafter referred to as Bt2Ir(acac)) (weight ratio of 92:8). Thereafter, the procedure including and subsequent to the formation of the electron-transport layer in Example 1 is followed.

In other words, the organic light emitting apparatus according to this example has a structure which has a W-organic layer 171 formed for respective subpixels and has a white color OLED device.

Example 5

The procedure up to and including the formation of the resist patter in Example 1 is followed.

Then, as illustrated in FIG. 8, the periodic structure 300 which protrudes upward is formed in the surface of the reflective electrode 102 by a lift-off process. An Ag alloy film is formed in a thickness of 30 nm by sputtering. In the exposed portion of the positive resist, the Ag alloy film is formed on the reflective electrode 102, while in a portion except the exposed portion of the positive resist, the Ag alloy film is formed on the resist. Then, the resist is stripped to remove the Ag alloy on the resist together, thereby forming the periodic structure 300 which protrudes upward.

In Example 5, the R-periodic structure 310 has a period of 345 nm, a side length of 200 nm, and a height of 30 nm. The G-periodic structure 320 has a period of 250 nm, a side length of 140 nm, and a height of 30 nm. The B-periodic structure 330 has a period of 200 nm, a side length of 145 nm, and a height of 30 nm. In each of the R-, G-, and B-periodic structures, the portion in which the periodic structure 300 is provided and the flat portion are alternatively arranged at every ten periods.

Next, the patterned resist is removed by a remover. In order to prevent the reflective electrode 102 made of Ag alloy and the periodic structures 300 from being degraded by oxidation or halogenation, a nitride film made of SiNx is formed as a protective layer in a thickness of 30 nm by sputtering. Then, an IZO film made of a transparent conductive material is formed in a thickness of 20 nm by sputtering. After that, electrode patterning is performed to form an anode with a photonic crystal.

Further, the device separation film 110 made of silicon oxynitride (SiN$_x$O$_y$) is formed in a thickness of 320 nm. Then, an opening serving as the EL region is formed for each sub-pixel by etching to produce an anode substrate in which photonic crystals are arranged.

The anode substrate is ultrasonically cleaned with isopropyl alcohol (IPA), washed with boiled water, and then dried. After that, the substrate was cleaned with UV/ozone and organic layers 111, 121, and 131 are formed for R, G, and B by vacuum evaporation.

A film of Compound 1 is formed for respective subpixels using a shadow mask. The R-hole-transport layer is formed in a thickness of 180 nm. The G-hole-transport layer is formed in a thickness of 120 nm. The B-hole-transport layer is formed in a thickness of 70 nm. At this time, the degree of vacuum is $1\times10^{-4}$ Pa and the evaporation rate is 0.2 nm/sec. Thereafter, the procedure including and subsequent to the formation of the emission layer in Example 2 is followed. Thereby, a structure having the protective layer for protecting the periodic structure is provided.

Comparative Example 1

The procedure up to and including the formation of the reflective layer 102 in Example 1 is followed. An IZO film is formed in a thickness of 20 nm by sputtering. Then, electrode patterning is performed to form an anode. Thereafter, the procedure including and subsequent to the formation of the hole-transport layer in Example 1 is followed. Thereby, a structure is provided which has the cavity but does not have a periodic structure.

Table 1 shows evaluation values obtained by numerical calculation on the emission intensity (intensity ratio at peak wavelength of emission spectrum of light extracted to outside) of each of the R-, G-, and B-devices in Example 1 and Comparative Example 1. It can be seen from Table 1 that when the emission intensity in Comparative Example 1 is set to 1, the emission intensity in Example 1 is approximately 1.8 in each of the R-, G-, and B-devices, and therefore that the light extraction efficiency is improved.

TABLE 1

|  | R | G | B |
|---|---|---|---|
| Example 1 | 1.79 | 1.78 | 1.77 |
| Comparative Example 1 | 1 | 1 | 1 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2007-295591, filed Nov. 14, 2007, and No. 2008-284513, filed Nov. 5, 2008, which are hereby incorporated by reference herein in their entirety.

The invention claimed is:

1. A light-emitting apparatus comprising:
a substrate;
a plurality of light-emitting devices formed on the substrate and each comprising a first electrode formed on the substrate; an emission layer formed on the first electrode; and a second electrode formed on the emission layer;
a cavity structure for resonating light emitted from the emission layer between a first reflective surface and a second reflective surface, the first reflective surface being located on the first electrode side relative to the emission layer, the second reflective surface being located on the second electrode side relative to the emission layer; and
a periodic structure formed in the first reflective surface, or in the second reflective surface, or between the first reflective surface and the second reflective surface,
wherein a height h of the periodic structure in a direction perpendicular to the substrate satisfies:

$$h < \frac{\lambda}{4n}$$

where λ is a peak wavelength of a spectrum of light extracted to outside, and n is an average refractive index between the first reflective surface and the second reflective surface.

2. The light-emitting apparatus according to claim 1, wherein the height h of the periodic structure is less than 130 nm.

3. The light-emitting apparatus according to claim 1, wherein the plurality of light-emitting devices include a light-emitting device for red light emission, a light-emitting device for green light emission, and a light-emitting device for blue light emission, and wherein the heights of the periodic structure in the plurality of light-emitting devices are equal to one another and each less than 60 nm.

4. The light-emitting apparatus according to claim 1, wherein the periodic structure is formed of a metal layer.

5. The light-emitting apparatus according to claim 1, wherein the periodic structure is formed in a part of a emission region of the light-emitting device.

6. The light-emitting apparatus according to claim 1, wherein the plurality of light-emitting devices include a light-emitting device for red light emission, a light-emitting device for green light emission, and a light-emitting device for blue light emission, and wherein the period of the periodic structure of the light-emitting device for red light emission is the largest of the devices of the three colors and the period of the periodic structure of the light-emitting device for blue light emission is the smallest of the devices of the three colors.

7. The light-emitting apparatus according to claim 1, wherein the periodic structure has a period larger than 125 nm and smaller than 780 nm.

8. The light-emitting apparatus according to claim 1, further comprising, on the periodic structure, a planarizing layer for planarizing a surface of the periodic structure, and wherein the emission layer is formed on the planarizing layer.

9. The light-emitting apparatus according to claim 1, wherein the periodic structure is provided between the emission layer and the substrate.

10. The light-emitting apparatus according to claim 1, wherein the periodic structure has a four-fold symmetry.

11. The light-emitting apparatus according to claim 1, wherein the second electrode is a light-transmissive electrode or a translucent metal electrode, and wherein the light emitted from the emission layer is extracted through the second electrode to outside.

12. The light-emitting apparatus according to claim 1, wherein the light-emitting device is an OLED device.

13. The light-emitting apparatus according to claim 5, wherein a distance between any position in the emission region and a periodic structure which is closest to the position is less than 10 μm.

14. The light-emitting apparatus according to claim 5, wherein a distance between the first reflective surface and the second reflective surface is larger than 70 nm and smaller than 715 nm.

* * * * *